(12) United States Patent
Park et al.

(10) Patent No.: US 11,639,470 B2
(45) Date of Patent: May 2, 2023

(54) ETCHING COMPOSITION FOR THIN FILM CONTAINING SILVER, METHOD FOR FORMING PATTERN AND METHOD FOR MANUFACTURING A DISPLAY DEVICE USING THE SAME

(71) Applicant: Samsung Display Co., Ltd., Yongin-Si (KR)

(72) Inventors: Jonghee Park, Hwaseong-si (KR); Hyoung Sik Kim, Seoul (KR); O Byoung Kwon, Jeonju-si (KR); Gi-Yong Nam, Hwaseong-si (KR); Kyungchan Min, Ansan-si (KR); Suck Jun Lee, Jeonju-si (KR); Youngmin Kim, Asan-si (KR); Jinhyung Kim, Cheonan-si (KR); Donghun Lee, Asan-si (KR); Kyu-Hun Lim, Cheonan-si (KR); Dongmin Jang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/388,712

(22) Filed: Jul. 29, 2021

(65) Prior Publication Data
US 2022/0204846 A1 Jun. 30, 2022

(30) Foreign Application Priority Data
Dec. 28, 2020 (KR) ........................ 10-2020-0185187

(51) Int. Cl.
*C09K 13/06* (2006.01)
*C23F 1/44* (2006.01)
(Continued)

(52) U.S. Cl.
CPC ................ *C09K 13/06* (2013.01); *C23F 1/02* (2013.01); *C23F 1/44* (2013.01); *H01L 51/0018* (2013.01); *H01L 51/0023* (2013.01)

(58) Field of Classification Search
None
See application file for complete search history.

(56) References Cited

U.S. PATENT DOCUMENTS 7,884,027 B2 * 2/2011 Uozumi ............ H01L 21/02071
438/745
8,921,230 B2 * 12/2014 Park .................... H01L 27/1259
438/692

(Continued)

FOREIGN PATENT DOCUMENTS

CN 105887091 A 8/2016
CN 106479504 A 3/2017
(Continued)

OTHER PUBLICATIONS

Chinese Office Action corresponding to Application No. 202111474948.7 and issued on Jan. 19, 2023, 7 pages.

*Primary Examiner* — Allan W. Olsen
(74) *Attorney, Agent, or Firm* — Innovation Counsel LLP

(57) ABSTRACT

An etching composition for a silver-containing thin film, the etching composition comprising an inorganic acid compound, a sulfonic acid compound, an organic acid compound, a nitrate, a metal oxidizing agent, an amino acid compound, and water.

10 Claims, 12 Drawing Sheets

(51) Int. Cl.
*H01L 51/00* (2006.01)
*C23F 1/02* (2006.01)

(56) References Cited

U.S. PATENT DOCUMENTS

| | | | |
|---|---|---|---|
| 10,611,962 | B2 | 4/2020 | Park et al. |
| 11,091,694 | B2 | 8/2021 | Park et al. |
| 11,390,805 | B2* | 7/2022 | Lee .................. C09K 13/06 |
| 11,407,943 | B2 | 8/2022 | Park et al. |
| 2003/0230549 | A1 | 12/2003 | Buchanan et al. |
| 2004/0072444 | A1 | 4/2004 | Park et al. |
| 2006/0278606 | A1 | 12/2006 | Park et al. |
| 2012/0199838 | A1 | 8/2012 | Park et al. |
| 2014/0295626 | A1* | 10/2014 | Park .................. H01L 29/78633 |
| | | | 252/79.4 |
| 2017/0104857 | A1 | 4/2017 | Nagasawa et al. |
| 2018/0310406 | A1 | 10/2018 | Ho et al. |
| 2018/0341346 | A1 | 11/2018 | Lovenich et al. |
| 2018/0371625 | A1 | 12/2018 | Park et al. |
| 2019/0097161 | A1 | 3/2019 | Im et al. |
| 2019/0153318 | A1 | 5/2019 | Park et al. |
| 2019/0322935 | A1 | 10/2019 | Park et al. |
| 2020/0027961 | A1 | 1/2020 | Kusayanagi et al. |
| 2020/0053881 | A1 | 2/2020 | Chung et al. |
| 2021/0238478 | A1* | 8/2021 | Lee .................. H01L 21/823462 |

FOREIGN PATENT DOCUMENTS

| | | |
|---|---|---|
| CN | 106676525 A | 5/2017 |
| CN | 106796885 A | 5/2017 |
| CN | 107557786 A | 1/2018 |
| CN | 107557787 A | 1/2018 |
| CN | 108048842 A | 5/2018 |
| CN | 108220963 A | 6/2018 |
| CN | 108385109 A | 8/2018 |
| CN | 108456886 A | 8/2018 |
| CN | 108698920 A | 10/2018 |
| CN | 108698921 A | 10/2018 |
| CN | 108930037 A | 12/2018 |
| CN | 108930038 A | 12/2018 |
| CN | 109385281 A | 2/2019 |
| CN | 109385634 A | 2/2019 |
| CN | 109423289 A | 3/2019 |
| CN | 109423647 A | 3/2019 |
| CN | 109797396 A | 5/2019 |
| CN | 109811344 A | 5/2019 |
| CN | 110158088 A | 8/2019 |
| CN | 110241423 A | 9/2019 |
| CN | 110295368 A | 10/2019 |
| CN | 110359050 A | 10/2019 |
| CN | 110387545 A | 10/2019 |
| CN | 110495260 A | 11/2019 |
| CN | 110521289 A | 11/2019 |
| CN | 110644003 A | 1/2020 |
| CN | 111187625 A | 5/2020 |
| CN | 111234824 A | 6/2020 |
| CN | 111910187 A | 11/2020 |
| JP | 2005-206903 A | 8/2005 |
| JP | 2008-534789 A | 8/2008 |
| JP | 2017-171992 A | 9/2017 |
| KR | 10-0712879 B1 | 4/2007 |
| KR | 10-0853216 B1 | 8/2008 |
| KR | 10-2009-0081566 A | 7/2009 |
| KR | 10-0993775 B1 | 11/2010 |
| KR | 10-2014-0063283 A | 5/2014 |
| KR | 10-2014-0063284 A | 5/2014 |
| KR | 10-1391603 B1 | 5/2014 |
| KR | 10-1459502 B1 | 11/2014 |
| KR | 10-1518055 B1 | 5/2015 |
| KR | 10-1537207 B1 | 7/2015 |
| KR | 10-2016-0025081 A | 3/2016 |
| KR | 10-2016-0097754 A | 8/2016 |
| KR | 10-2016-0100591 A | 8/2016 |
| KR | 10-2016-0130808 A | 11/2016 |
| KR | 10-1695608 B1 | 1/2017 |
| KR | 10-2017-0128819 A | 11/2017 |
| KR | 10-2018-0020273 A | 2/2018 |
| KR | 10-2018-0066764 A | 6/2018 |
| KR | 10-1868387 B1 | 6/2018 |
| KR | 10-2018-0094495 A | 8/2018 |
| KR | 10-2018-0097143 A | 8/2018 |
| KR | 10-2018-0098781 A | 9/2018 |
| KR | 10-2018-0101200 A | 9/2018 |
| KR | 10-2018-0102438 A | 9/2018 |
| KR | 10-1905195 B1 | 10/2018 |
| KR | 10-2018-0127902 A | 11/2018 |
| KR | 10-2019-0000428 A | 1/2019 |
| KR | 10-2019-0002381 A | 1/2019 |
| KR | 10-2019-0017473 A | 2/2019 |
| KR | 10-2019-0017474 A | 2/2019 |
| KR | 10-2019-0023172 A | 3/2019 |
| KR | 10-2019-0024738 A | 3/2019 |
| KR | 10-2019-0057018 A | 5/2019 |
| KR | 10-2019-0058758 A | 5/2019 |
| KR | 10-2019-0058759 A | 5/2019 |
| KR | 10-2019-0072408 A | 6/2019 |
| KR | 10-1985167 B1 | 6/2019 |
| KR | 10-2019-0097919 A | 8/2019 |
| KR | 10-2019-0106645 A | 9/2019 |
| KR | 10-2019-0111596 A | 10/2019 |
| KR | 10-2019-0111658 A | 10/2019 |
| KR | 10-2020-0001507 A | 1/2020 |
| KR | 10-2020-0011025 A | 1/2020 |
| KR | 10-2020-0056285 A | 5/2020 |

\* cited by examiner

ETCHING COMPOSITION FOR THIN FILM CONTAINING SILVER, METHOD FOR FORMING PATTERN AND METHOD FOR MANUFACTURING A DISPLAY DEVICE USING THE SAME

CROSS-REFERENCE TO RELATED APPLICATION

This application claims priority from and the benefit of Korean Patent Application No. 10-2020-0185187, filed on Dec. 28, 2020, which is hereby incorporated by reference for all purposes as if fully set forth herein.

BACKGROUND

1. Field

Embodiments relate to an etching composition. More particularly, embodiments relate to an etching composition for a silver-containing thin film, a method for forming a pattern and a method for manufacturing a display device using the etching composition.

2. Description of the Related Art

An organic light-emitting display device emits light. Organic light-emitting display devices have a reduced weight and thickness and have characteristics appropriate for a flexible display device. Usage of organic light-emitting display devices has increased.

A reflective electrode of the organic light-emitting display device may include silver (Ag). A silver-containing thin film may be etched by wet etching.

When the silver-containing thin film is etched by an etching composition, silver ions may be dissolved in the etching composition. The silver ions dissolved in the etching composition may adsorb to other metal patterns thereby forming a silver particle. The silver particle may be transferred to the reflective electrode in other processes thereby causing defects or failure in manufacturing processes.

SUMMARY

Embodiments provide an etching composition for a silver-containing thin film.

Embodiments provide a method for forming a pattern using the etching composition.

Embodiments provide a method for manufacturing a display device using the etching composition.

According to an embodiment, the etching composition for the silver-containing thin film may include an inorganic acid compound, a sulfonic acid compound, an organic acid compound, a nitrate, a metal oxidizing agent, an amino acid compound, and water.

In an embodiment, the sulfonic acid compound may include at least one selected from the group consisting of methanesulfonic acid, ethanesulfonic acid, p-toluenesulfonic acid, benzenesulfonic acid, amino methylsulfonic acid, and sulfamic acid.

In an embodiment, the organic acid compound may include at least one selected from the group consisting of acetic acid, citric acid, glycolic acid malonic acid, lactic acid, tartaric acid, butanoic acid, formic acid, gluconic acid, oxalic acid, pentanoic acid, sulfobenzoic acid, sulfosuccinic acid, sulfophthalic acid, salicylic acid, sulfosalicylic acid, benzoic acid, glyceric acid, succinic acid, malic acid, isocitric acid, propenoic acid, iminodiacetic acid and ethylenediaminetetraacetic acid.

In an embodiment, the nitrate may include at least one selected from the group consisting of sodium nitrate, potassium nitrate, ammonium nitrate, calcium nitrate, magnesium nitrate, and aluminum nitrate.

In an embodiment, the metal oxidizing agent may include at least one selected from the group consisting of ferric nitrate, ferric sulfate, copper, and copper sulfate.

In an embodiment, the amino acid compound may include at least one selected from the group consisting of glycine, alanine, valine, leucine, isoleucine, serine, threonine, aspartic acid, cysteine, and methionine.

In an embodiment, the inorganic acid compound may include nitric acid.

In an embodiment, the etching composition may include 1 wt % to 13 wt % of the inorganic acid compound, 0.1 wt % to 7 wt % of the sulfonic acid compound, 30 wt % to 55 wt % of the organic acid compound, 1 wt % to 17 wt % of the nitrate, 0.01 wt % to 0.09 wt % of the metal oxidizing agent, 0.1 wt % to 7 wt % of the amino acid compound, and a remainder of the etching composition may include water.

In an embodiment, the inorganic acid compound may include nitric acid, the sulfonic acid compound may include methanesulfonic acid, the organic acid compound may include citric acid and acetic acid, the nitrate may include calcium nitrate and ammonium nitrate, the metal oxidizing agent may include ferric nitrate, and the amino acid compound may include glycine.

In an embodiment, the etching composition may not include ammonium bisulfate.

In an embodiment, the etching composition may not include phosphoric acid.

According to an embodiment, the method for forming the pattern may include forming a multilayer including a silver-containing thin film and a metal oxide thin film. The metal oxide thin film is etched using a first etching composition. The silver-containing thin film is etched using a second etching composition comprising an inorganic acid compound, a sulfonic acid compound, an organic acid compound, a nitrate, a metal oxidizing agent, an amino acid compound, and water.

In an embodiment, the second etching composition may include 1 wt % to 13 wt % of the inorganic acid compound, 0.1 wt % to 7 wt % of the sulfonic acid compound, 30 wt % to 55 wt % of the organic acid compound, 1 wt % to 17 wt % of the nitrate, 0.01 wt % to 0.09 wt % of the metal oxidizing agent, 0.1 wt % to 7 wt % of the amino acid compound, and a remainder of the second etching composition may include water.

In an embodiment, the inorganic acid compound may include nitric acid, the sulfonic acid compound may include methanesulfonic acid, the organic acid compound may include citric acid and acetic acid, the nitrate may include calcium nitrate and ammonium nitrate, the metal oxidizing agent may include ferric nitrate, and the amino acid compound may include glycine.

According to an embodiment, the method for manufacturing the display device may include forming an active pattern in a display area on a base substrate. A gate metal pattern including a gate electrode overlapping the active pattern is formed. A source metal pattern including a connection pad disposed in a peripheral area surrounding the display area is formed. A multiple layer on the source metal pattern is formed. The multiple layer includes a lower layer including a metal oxide, an intermediate layer disposed on the lower layer and including silver or a silver alloy, and an upper layer disposed on the intermediate layer and including a metal oxide. The upper layer is etched using a first etching composition. The intermediate layer is etched using a second etching composition comprising an inorganic acid compound, a sulfonic acid compound, an organic acid compound, a nitrate, a metal oxidizing agent, an amino acid compound, and water. The lower layer is etched using a third etching composition to form an electrode pattern in the display area and to expose the connection pad.

In an embodiment, the source metal pattern may have a single-layer structure or a multiple-layer structure, the source metal pattern including aluminum.

In an embodiment, the metal oxide may include at least one selected from the group consisting of indium oxide, zinc oxide, tin oxide, indium tin oxide and indium zinc oxide.

In an embodiment, the second etching composition may include 1 wt % to 13 wt % of the inorganic acid compound, 0.1 wt % to 7 wt % of the sulfonic acid compound, 30 wt % to 55 wt % of the organic acid compound, 1 wt % to 17 wt % of the nitrate, 0.01 wt % to 0.09 wt % of the metal oxidizing agent, 0.1 wt % to 7 wt % of the amino acid compound, and a remainder of the second etching composition may include water.

In an embodiment, the inorganic acid compound may include nitric acid, the sulfonic acid compound may include methanesulfonic acid, the organic acid compound may include citric acid and acetic acid, the nitrate may include calcium nitrate and ammonium nitrate, the metal oxidizing agent may include ferric nitrate, and the amino acid compound may include glycine.

In an embodiment, the method may further include connecting a driving chip, which generates a driving signal, to the connection pad.

According to the embodiments, etching compositions may have selectivity for a silver-containing thin film with respect to a metal oxide such as indium oxide, and may prevent damage of other metal layers including aluminum or the like, and may prevent reductive precipitation of silver particles.

Furthermore, when etching a silver-containing thin film, the etching composition may prevent etching residues from occurring and may form a CD-skew having an appropriate length.

Furthermore, the stability of the etching compositions for cumulative use and over time may be improved.

Thus, defects in manufacturing processes for a display device may be reduced, and the reliability of the display device may be improved.

BRIEF DESCRIPTION OF THE DRAWINGS

Features will become apparent to those of skill in the art by describing in detail embodiments with reference to the attached drawings.

DETAILED DESCRIPTION

Figure 1:
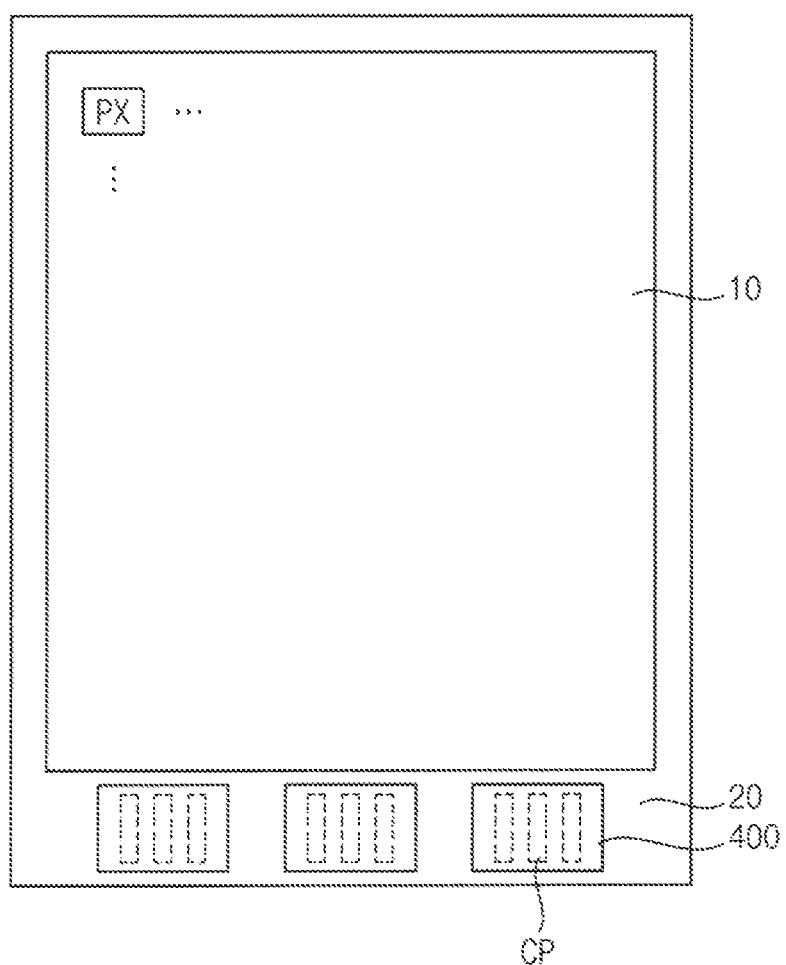
FIG. 1 illustrates a plan view of a display device manufactured according to an embodiment.

An etching composition for a silver-containing thin film, a method for forming a pattern and a method for manufacturing a display device according to embodiments will be described hereinafter with reference to the accompanying drawings, in which some embodiments are shown. Same or similar reference numerals may be used for same or similar elements in the drawings.

An Etching Composition for a Silver-Containing Thin Film

An etching composition according to an embodiment may include an inorganic acid compound, a sulfonic acid compound, an organic acid compound, a nitrate, a metal oxidizing agent, an amino acid compound, and water. The etching composition may be used for etching a silver-containing thin film, which contains silver or a silver alloy. Accordingly, a multilayer structure may be etched by dividing the operations.

The inorganic acid compound may include nitric acid. The nitric acid may act as a main oxidizing agent for the silver (Ag) component. In addition, the nitric acid may also act as an oxidizing agent for a transparent conductive layer. The transparent conductive layer may include indium tin oxide ("ITO"), indium zinc oxide ("IZO"), indium gallium oxide ("IGO"), indium zinc tin oxide ("ITZO"), indium gallium zinc oxide ("IGZO"), and the like.

In embodiments, a content of nitric acid may be about 1.0 wt % to about 13.0 wt %, suitably about 5.0 wt % to about 11.0 wt %. If the content of nitric acid is higher than 13.0 wt %, an etching rate is too high, and it is difficult to control the degree of etching, so that a target thin film may be over-etched. If the nitric acid is less than 1.0 wt %, the etching rate may decrease, and thus sufficient etching may not be performed. When the content of nitric acid is adjusted within the above content range, it is easy to control the etching rate using the etching composition, and the target thin film can be uniformly etched.

The sulfonic acid compound may serve as an etching aid for the silver component, may increase the silver etching rate, and prevent a silver residue. In addition, the sulfonic acid compound may reduce a decomposition rate of the inorganic acid compound to maintain a constant etching rate of the silver-containing thin film.

In embodiments, the content of the sulfonic acid compound may be about 0.1 wt % to about 7.0 wt %, suitably about 2.0 wt % to about 6.0 wt %. If a content of the sulfonic acid compound is higher than 7.0 wt %, an etching rate of the silver-containing thin film may be excessively increased, resulting in poor erosion. If the content of the sulfonic acid compound is less than 0.1 wt %, a decomposition rate of the inorganic acid compound may increase, thereby impairing the stability of the etching composition, and a silver residue may occur.

Examples of the sulfonic acid compound include methanesulfonic acid ($CH_3SO_3H$), ethanesulfonic acid ($CH_3CH_2SO_3H$), p-toluenesulfonic acid ($CH_3C_6H_4SO_3H$), benzenesulfonic acid ($C_6H_5SO_3H$), amino methylsulfonic acid ($CH_5NO_3S$), sulfamic acid ($H_3NSO_3$), and the like, and these may be used alone or in combination. In embodiments, it may be desirable to include methanesulfonic acid in the etching composition.

The organic acid compound may serve as an etchant for the silver-containing thin film. The organic acid compound may be used to etch the silver-containing thin film oxidized by the nitric acid.

In embodiments, a content of the organic acid compound may be about 30.0 wt % to about 55.0 wt %, suitably about 40.0 wt % to about 55.0 wt %. If the content of the organic acid compound is higher than 55.0 wt %, an etching rate of the silver-containing thin film may be excessively increased, resulting in poor erosion. If the content of the organic acid compound is less than 30.0 wt %, a decomposition rate of the organic acid compound may increase, thereby impairing the stability of the etching composition, and a silver residue may occur. If the content of the organic acid compound is controlled within the above content range, it is easy to control the rate of etching using the etching composition, and it is possible to prevent silver residue and silver re-adsorption accordingly.

Examples of the organic acid compound may include at least one or two or more substances selected from the group including acetic acid ($CH_3COOH$), citric acid ($C_6H_8O_7$), glycolic acid ($CH_2OHCOOH$), malonic acid ($C_3H_4O_4$), lactic acid ($C_3H_6O_3$), tartaric acid ($C_4H_6O_6$), butaonic acid ($CH_3CH_2CH_2COOH$), formic acid (HCOOH), gluconic acid ($C_6H_{12}O_7$), oxalic acid ($C_2H_2O_4$), pentanic acid ($CH_3(CH_2)_3COOH$), sulfobenzoic acid, sulfosuccinic acid ($C_4H_6O_7S$), sulfophthalic acid, salicylic acid ($C_7H_6O_3$), sulfosalicylic acid dehydrate ($C_7H_6O_6S$), benzoic acid ($C_7H_6O_2$), glyceric acid, succinic acid (($CH_2)_2(CO_2H)_2$), malic acid ($C_4H_6O_5$), isoctric acid ($C_6H_8O_7$), propenoic acid, iminodiacetic acid, $HN(CH_2CO_2H)_2$), ethylenediaminetetraacetic acid ($C_{10}H_{16}N_2O_8$), and the like. Suitably, the organic acid compound may include one or two or more substances selected from acetic acid, citric acid, glycolic acid, malonic acid, lactic acid, and tartaric acid.

The nitrate is a remover for removing the silver residue, and may serve to remove the silver residue. Compared with other salts such as sulfate, the nitrate has a high oxidation potential and may relatively easily oxidize silver and other metals. Since the etching composition includes the nitrate, an etching rate may be controlled, and a side etching of the silver-containing thin film may be controlled.

The etching composition according to embodiments may be used to etch multilayer films containing silver such as ITO/Ag/ITO by dividing the etching into three operations. That is, the etching composition may be used to etch a layer containing silver in a process of sequentially etching ITO, Ag, and ITO. In this case, when the etching composition includes sulfate, the sulfate may remove silver and simultaneously etch ITO. Accordingly, the etching composition may secure a high selectivity to silver by including nitrate instead of sulfate having a high oxidation potential.

In embodiments, a content of the nitrate may be about 1.0 wt % to about 17.0 wt %, suitably about 5.0 wt % to about 15.0 wt %. When a content of the nitrate is controlled within the above content range, it is easy to control an etching time using the etching composition, and the silver-containing thin film can be uniformly etched.

Examples of the nitrate may include at least one selected from the group including sodium nitrate, potassium nitrate, ammonium nitrate, calcium nitrate, magnesium nitrate, aluminum nitrate, and the like. Suitably, the nitrate may include calcium nitrate.

The metal oxidizing agent may increase the etching rate for the silver component. According to embodiments, the content of the metal oxidizing agent may be about 0.01 wt % to about 0.09 wt %, suitably about 0.02 wt % to about 0.06 wt %. When a content of the metal oxidizing agent is higher than 0.09 wt %, the etching rate of the silver-containing thin film is excessively increased, so that the CD-skew may be excessively increased, where the CD-skew is the distance between an end of a photoresist pattern used to etch the silver-containing film and an end of the silver containing film (Ag layer). In addition, when the content of the metal oxidizing agent is lower than 0.01 wt %, an etching rate of the silver-containing thin film is excessively decreased, and a residue may be generated.

The metal oxidizing agent may be at least one selected from the group including metals such as iron and copper, or metal salts such as iron, copper, aluminum, molybdenum, chromium, and manganese. In embodiments, the metal oxidizing agent may include at least one selected from a group including ferric nitrate, ferric sulfate, copper, and copper sulfate.

The amino acid compound may serve as an auxiliary agent for increasing the number of sheets of the silver-containing thin film that can be processed using the etching composition. The amino acid compound may inhibit the activity of silver ions by combining the silver ions dissolved in the etching solution after etching the silver-containing thin film. Accordingly, it is possible to minimize a change in the characteristics of the etchant, and accordingly, the etchant can be continuously used.

In embodiments, a content of the amino acid compound may be about 0.1 wt % to about 7.0 wt %, suitably about 0.5 wt % to about 5.0 wt %. When a content of the amino acid compound is controlled within the above content range, it is possible to easily control the number of processed sheets of the silver-containing thin film, reduce the amount of lateral etching, and minimize defects caused by re-adsorption of silver. For example, a variation amount of the side etching may mean a difference in the degree to which the side is etched when etching a plurality of silver-containing thin films.

The amino acid compound may include at least one selected from the group including glycine, alanine, valine, leucine, isoleucine, serine, threonine, aspartic acid, cysteine, methionine, and the like. Suitably, the amino acid compound may include glycine and alanine.

A content of water may correspond to the remainder of the etching composition, excluding the content of nitric acid, sulfonic acid compound, organic acid compound, nitrate compound, metal oxidizing agent, and amino acid compound. Water may be deionized water for semiconductor processing. Suitably, deionized water of 1 MΩ/cm or more may be used as the water.

Suitably, the etching composition is substantially free of phosphoric acid. Phosphoric acid may cause damage to metals that are not to be etched, such as aluminum, and may increase process defects by increasing the reductive precipitation of silver.

In addition, phosphoric acid may etch metal oxides such as indium tin oxide. By excluding phosphoric acid, the etching composition may selectively etch silver in a multilayer structure including a metal oxide such as indium tin oxide.

Method for Manufacturing a Display Device

FIG. 1 is a plan view illustrating a display device 100 manufactured according to an embodiment. FIGS. 2 to 11 are cross-sectional views illustrating a method for manufacturing a display device according to an embodiment. FIG. 12 is a cross-sectional view illustrating a display device manufactured according to an embodiment.

Referring to FIG. 1, the display device 100 includes a display area 10 and a peripheral area 20 surrounding the display area 10.

In the peripheral area 20, connection pads CP electrically connected to an external device may be disposed. For example, the connection pads CP may be connected to a driving chip 400 providing a driving signal such as a data signal, a gate signal or the like. The driving signal provided by the driving chip 400 may be transferred to pixels PX in the display area 10 through the connection pads CP.

In an embodiment, the display device 100 may be an organic light-emitting display device. For example, an array of the pixels PX may be disposed in the display area 10, and each of the pixels PX may include an organic light-emitting diode and a circuit part for driving the organic light-emitting diode.

Figure 2:
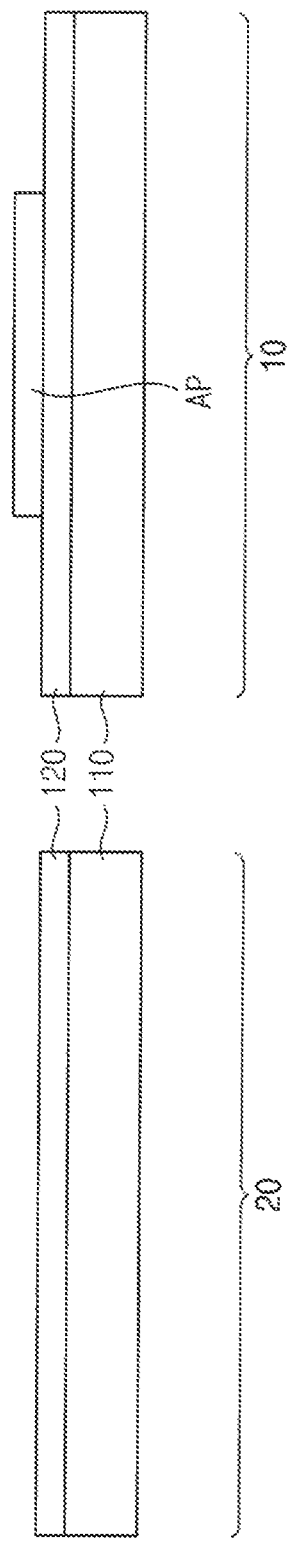
FIGS. 2, 3, 4, 5, 6, 7, 8, 9, 10, and 11 illustrate cross-sectional views of stages of a method for manufacturing a display device according to an embodiment.

Referring to FIG. 2, a buffer layer 120 is formed on a base substrate 110.

For example, the base substrate 110 may include glass, quartz, silicon, a polymer or the like. For example, the polymer may include polyethylene terephthalate, polyethylene naphthalate, polyether ketone, polycarbonate, polyarylate, polyether sulfone, polyimide or a combination thereof.

The buffer layer 120 may prevent or reduce penetration of impurities, humidity or external gas from underneath the base substrate 110, and may planarize an upper surface of the base substrate 110. For example, the buffer layer 120 may include an inorganic material such as oxide, nitride or the like.

An active pattern AP is formed on the buffer layer 120 in the display area 10.

For example, the active pattern AP may include a semiconductive material such as amorphous silicon, polycrystalline silicon (polysilicon), a metal oxide or the like. In an embodiment, the active pattern AP may include polysilicon. At least a portion of the active pattern AP including polysilicon may be doped with impurities such as n-type impurities or p-type impurities.

Figure 3:
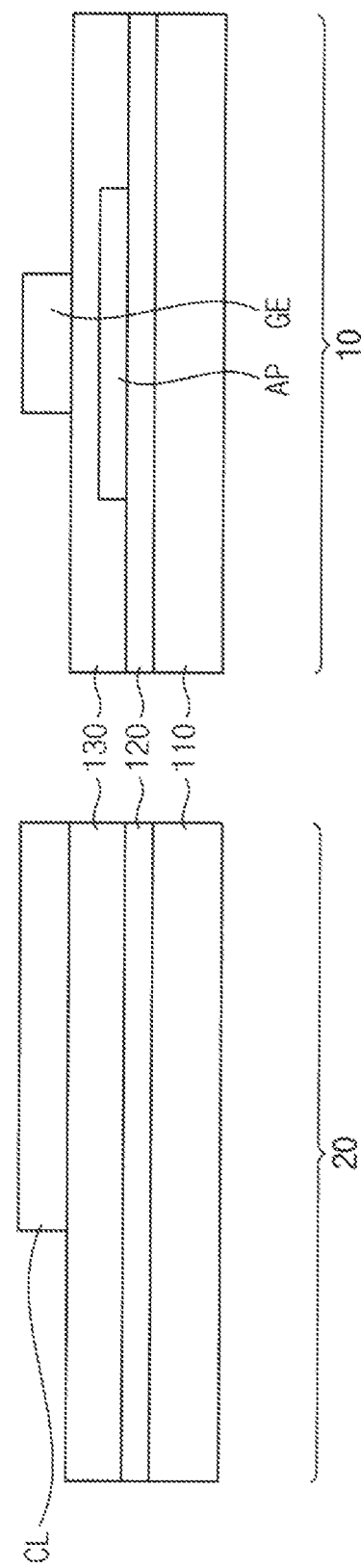

Referring to FIG. 3, a first insulation layer 130 is formed on the active pattern AP. For example, the first insulation layer 130 may include silicon oxide, silicon nitride, silicon carbide or a combination thereof. Furthermore, the first insulation layer 130 may include an insulating metal oxide such as aluminum oxide, tantalum oxide, hafnium oxide, zirconium oxide, titanium oxide or the like. For example, the first insulation layer 130 may have a single-layer structure or a multiple-layer structure including silicon nitride and/or silicon oxide.

A gate metal pattern including a gate electrode GE and a connection line CL is formed on the first insulation layer 130.

For example, the gate metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layer structure or a multiple-layer structure including different metal layers.

The connection line CL may be disposed in the peripheral area 20, and may extend into the display area 10.

In an embodiment, after the gate electrode GE is formed, a portion of the active pattern AP may be doped with impurities through an ion-implantation process.

Figure 4:
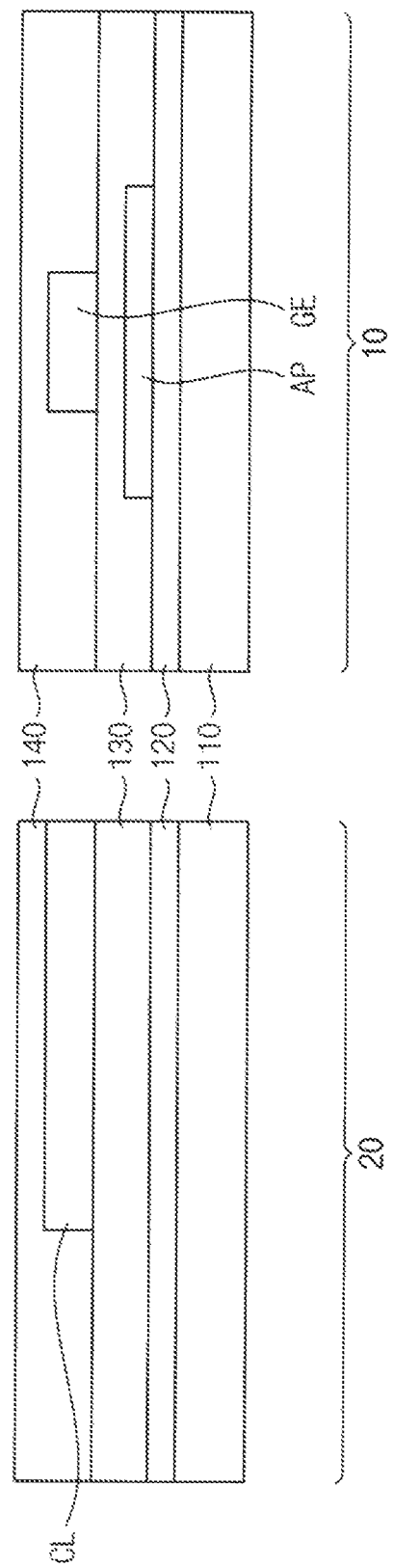

Referring to FIG. 4, a second insulation layer 140 is formed to cover the gate metal pattern and the first insulation layer 130.

For example, the second insulation layer 140 may include silicon oxide, silicon nitride, silicon carbide or a combination thereof. Furthermore, the second insulation layer 140 may include an insulating metal oxide such as aluminum oxide, tantalum oxide, hafnium oxide, zirconium oxide, titanium oxide or the like. For example, the second insulation layer 140 have a single-layer structure or a multiple-layer structure including silicon nitride and/or silicon oxide.

Figure 5:
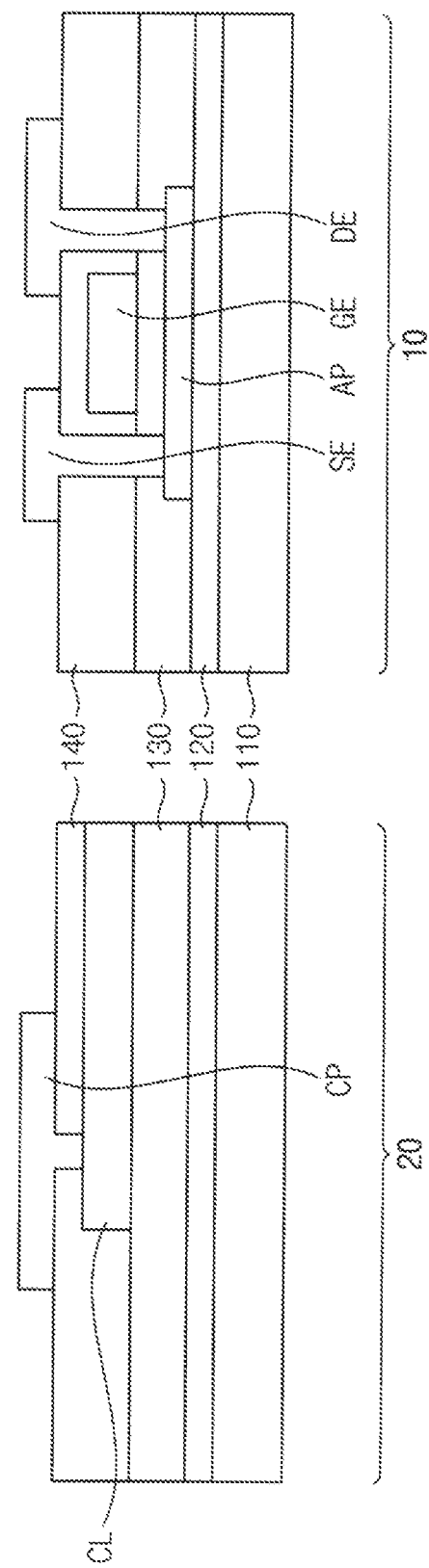

Referring to FIG. 5, a source metal pattern including a source electrode SE, a drain electrode DE and a connection pad CP is formed on the second insulation layer 140.

The source electrode SE and the drain electrode DE may respectively pass through the first and second insulation layers 130 and 140 to contact the active pattern AP.

The connection pad CP is disposed in the peripheral area 20, and may pass through the second insulation layer 140 to contact the connection line CL.

For example, the source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layer structure or a multiple-layer structure including different metal layers. In an embodiment, the source metal pattern may include aluminum. For example, the source metal pattern may have a double-layer structure of titanium/aluminum or a triple-layer structure of titanium/aluminum/titanium.

Figure 6:
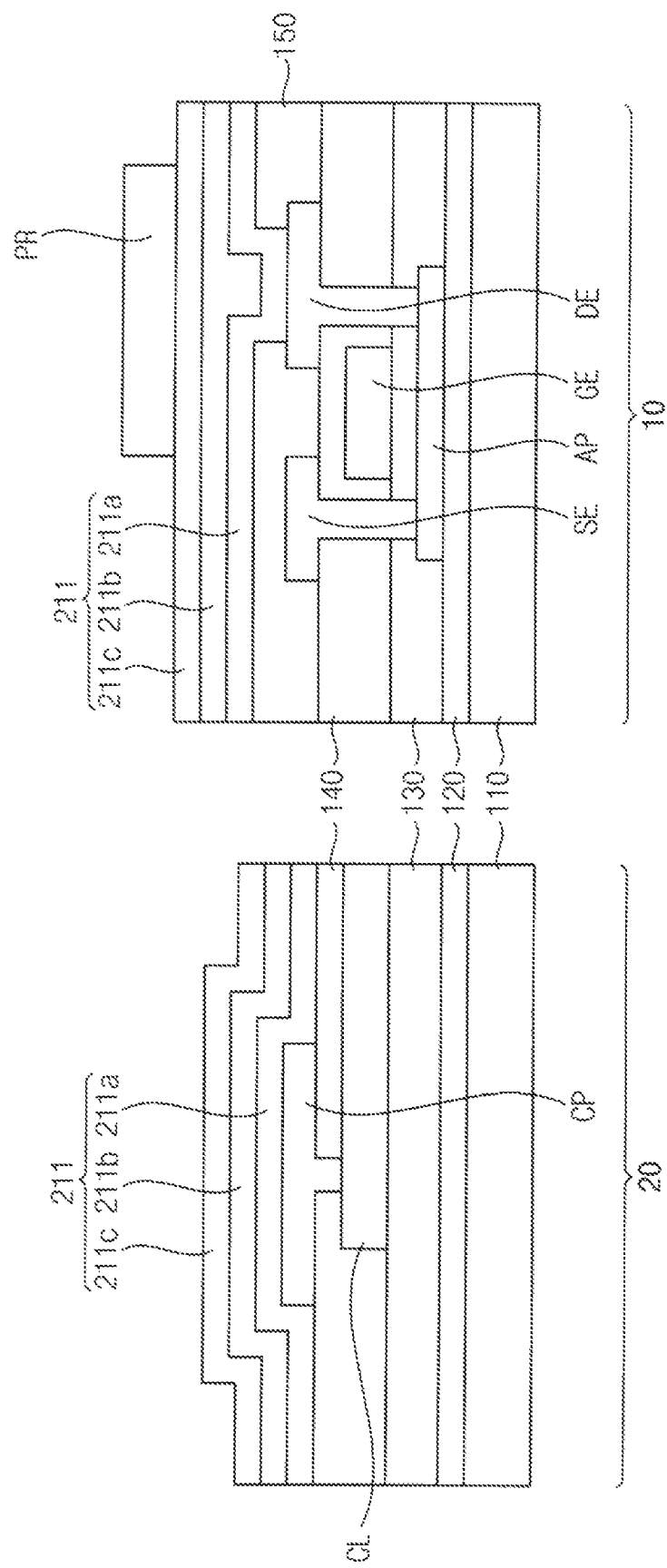

Referring to FIG. 6, a third insulation layer 150 is formed to cover the source electrode SE and the drain electrode DE. In an embodiment, the connection pad CP is not covered by the third insulation layer 150 so that an entire supper surface of the connection pad CP is exposed. The third insulation layer 150 includes an opening exposing at least a portion of the drain electrode DE.

For example, the third insulation layer 150 may include an inorganic insulation material, an organic insulation material or a combination thereof. For example, the organic insulation material may include a phenol resin, an acryl resin, a polyimide resin, a polyamide resin, an epoxy resin, benzocyclobetene or the like.

A lower electrode layer 211 is formed on the connection pad CP and the third insulation layer 150. The lower electrode layer 211 may include a metal, a metal alloy, a metal oxide or a combination thereof.

For example, the lower electrode layer 211 may have a multiple-layer structure including a metal oxide layer and a metal layer. The metal oxide layer may include indium oxide, zinc oxide, tin oxide, indium tin oxide, indium zinc oxide, zinc tin oxide or the like. The metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof.

In an embodiment, the lower electrode layer 211 may have a multiple-layer structure including a lower layer 211a, an intermediate layer 211b and an upper layer 211c. In an embodiment, the lower layer 211a and the upper layer 211c may include indium tin oxide, and the intermediate layer 211b may include silver.

The lower electrode layer 211 may contact the drain electrode DE through the opening of the third insulation layer 150. A photoresist pattern PR overlapping the drain electrode DE is formed on the lower electrode layer 211.

Figure 7:
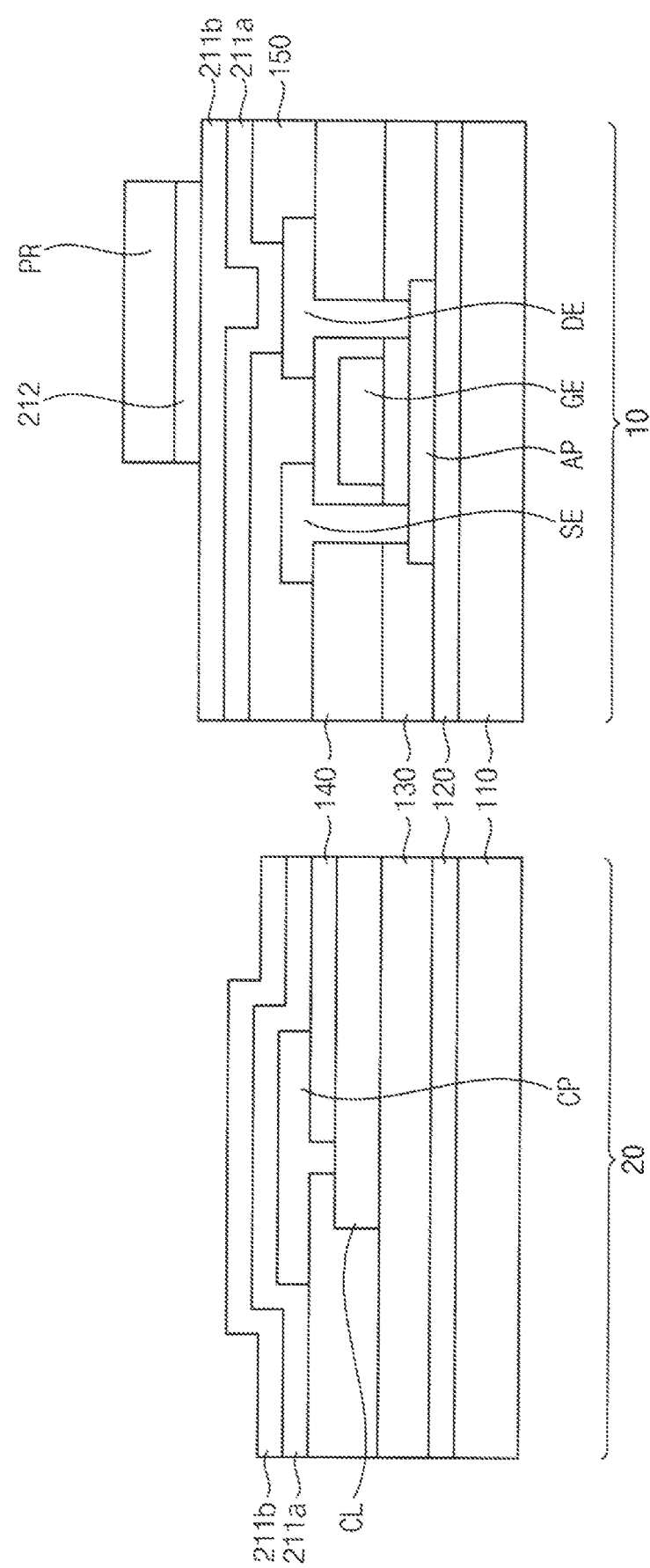

Referring to FIG. 7, the upper layer 211c of the lower electrode layer 211 is etched using the photoresist pattern PR as a mask to form an upper pattern 212. Thus, the upper pattern 212 is formed under the photoresist pattern PR, and the remainder of the upper layer 211c is removed to expose an upper surface of the intermediate layer 211b.

The upper layer 211c including indium tin oxide may be wet-etched using a first etching composition.

In an embodiment, the first etching composition may include nitric acid, a chlorinated compound, an ammonium compound, a cyclic amine compound, and water.

Examples of the chlorinated compound may include sodium chloride, potassium chloride, ammonium chloride and the like. These may be used each alone or in combination thereof.

Examples of the ammonium compound may include ammonium acetate, ammonium sulfamate, ammonium benzenediol, ammonium carbanate, ammonium dihydrogen phosphate, ammonium formate, ammonium bicarbonate, ammonium citrate, ammonium nitrate, ammonium persulfate, ammonium sulphamate, ammonium sulfate and the like. These may be used each alone or in combination thereof.

Examples of the cyclic amine compound may include benzotriazole, 5-aminotetrazole, 3-aminotetrazole, 5-methyltetrazole and the like. These may be used each alone or in combination thereof.

For example, the first etching composition may include 3 wt % to 10 wt % of nitric acid, 0.01 wt % to 5 wt % of the chlorinated compound, 0.1 wt % to 5 wt % of the ammonium compound, 0.1 wt % to 5 wt % of the cyclic amine compound, and a remainder of water.

In an embodiment, the first etching composition may include nitric acid, sulfuric acid, an ammonium compound, a cyclic amine compound and water. For example, the first etching composition may include 1 wt % to 10 wt % of nitric acid, 1 wt % to 10 wt % of sulfuric acid, 0.1 wt % to 5 wt % of the ammonium compound, 0.1 wt % to 5 wt % of the cyclic amine compound and a remainder of water.

Figure 8:
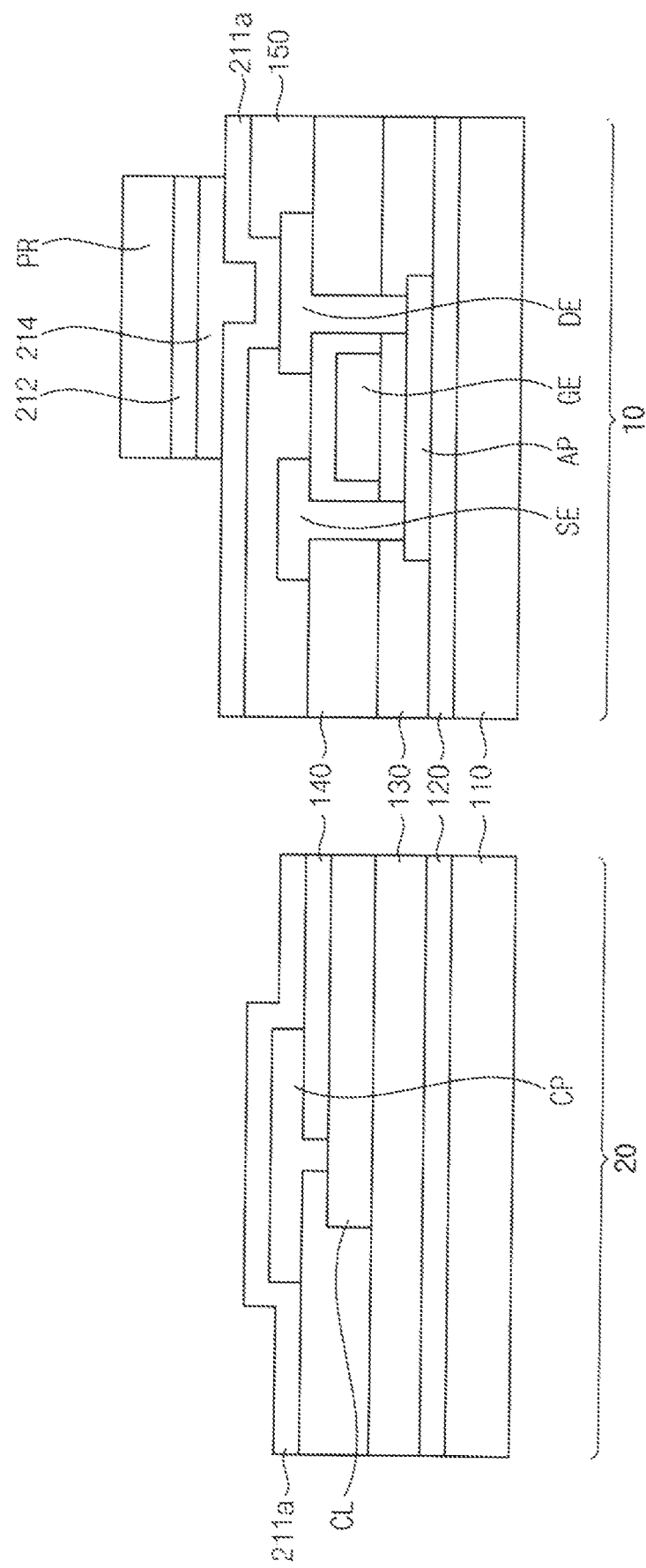

Referring to FIG. 8, the intermediate layer 211b of the lower electrode layer 211 is etched using the photoresist pattern PR as a mask to form an intermediate pattern 214. Thus, the intermediate pattern 214 is formed under the upper pattern 212 and the photoresist pattern PR, and the remainder of the intermediate layer 211b is removed to expose an upper surface of the lower layer 211c.

The intermediate layer 211b containing silver may be wet-etched using a second etching composition.

In an embodiment, the second etching composition may have a same composition as the previously explained etching composition for a silver-containing thin film. For example, the second etching composition may include an inorganic acid compound, a sulfonic acid compound, an organic acid compound, a nitrate, a metal oxidizing agent, an amino acid compound, and water.

Figure 9:
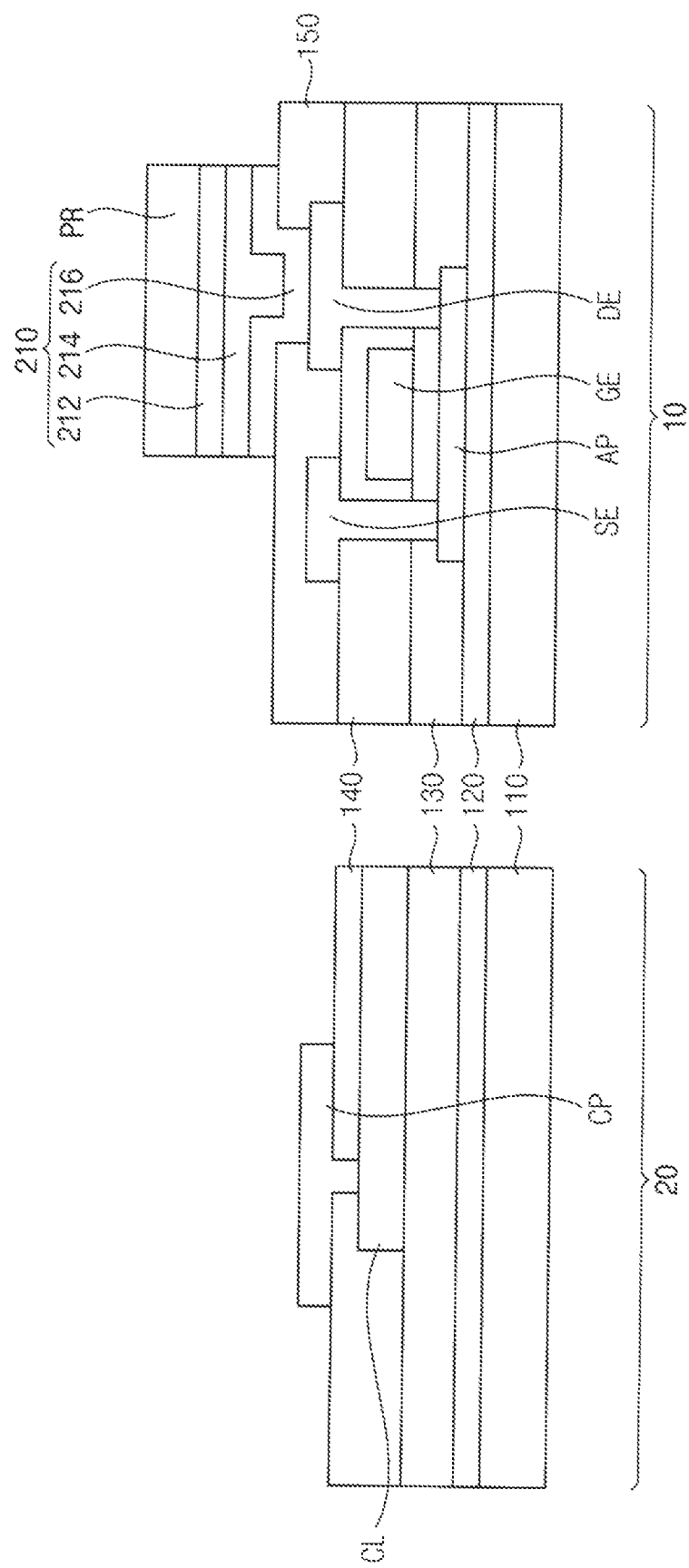

Referring to FIG. 9, the lower layer 211a of the lower electrode layer 211 is etched using the photoresist pattern PR as a mask to form a lower pattern 216. Thus, a lower electrode 210 including the lower pattern 216, the intermediate pattern 214 and the upper pattern 212 is formed under the photoresist pattern PR. The lower pattern 216 contacts the drain electrode DE.

In an embodiment, the lower layer 211a including indium tin oxide may be wet-etched using a third etching composition. For example, the third etching composition may have a substantially same composition as the first etching composition.

In an embodiment, the lower electrode 210 may be an anode of an organic light-emitting diode. The remainder of the lower layer 211a excluding the lower pattern 216 may be removed to expose the connection pad CP.

Figure 10:
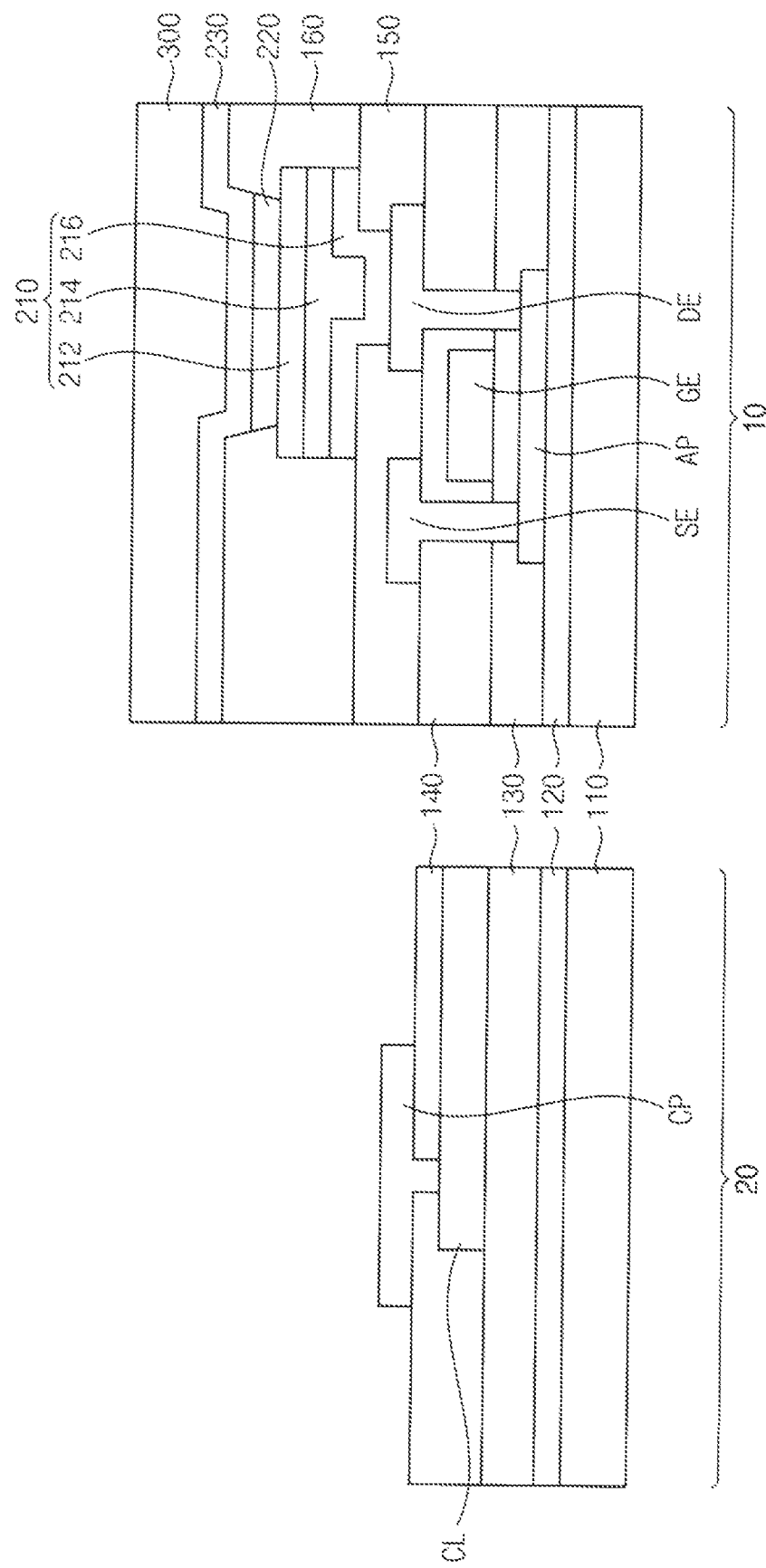

Referring to FIG. 10, a pixel-defining layer 160 may be formed on the third insulation layer 150. The pixel-defining layer 160 may include an opening that exposes at least a portion of the lower electrode 210. For example, the pixel-defining layer 160 may include an organic insulation material.

An organic light-emitting layer 220 is formed on the lower electrode 210. For example, the organic light-emitting layer 220 may be disposed in the opening of the pixel-defining layer 160. However, in embodiments, the organic light-emitting layer 220 may extend over an upper surface of the pixel-defining layer 160, or may continuously extend over a plurality of the pixels in the display area 10.

The organic light-emitting layer 220 may include at least a light-emitting layer, and may further include at least one of a hole-injection layer (HIL), a hole-transporting layer (HTL), an electron-transporting layer (ETL) and an electron-injection layer (EIL). For example, the organic light-emitting layer 220 may include a low molecular weight organic compound or a high molecular weight organic compound.

In an embodiment, the organic light-emitting layer 220 may emit a red light, a green light or a blue light. In an embodiment, the organic light-emitting layer 220 may emit a white light. The organic light-emitting layer 220 emitting a white light may have a multiple-layer structure including a red-emitting layer, a green-emitting layer and a blue-emitting layer, or a single-layer structure including a mixture of a red-emitting material, a green-emitting material and a blue-emitting material.

An upper electrode 230 is formed on the organic light-emitting layer 220. In an embodiment, the upper electrode 230 may continuously extend over a plurality of the pixels in the display area 10.

In an embodiment, the upper electrode 230 may function as a cathode. For example, the upper electrode 230 may be formed as a transmitting electrode or a reflecting electrode according to an emission type of the display device. For example, when the upper electrode 230 is a transmitting electrode, the upper electrode 230 may include lithium (Li), calcium (Ca), lithium fluoride (LiF), aluminum (Al), magnesium (Mg), or a combination thereof, and the display device may further include a sub electrode or a bus electrode line, which includes indium tin oxide, indium zinc oxide, zinc tin oxide, indium oxide, zinc oxide, tin oxide or the like.

In an embodiment, a thin-film encapsulation layer 300 may be formed on the upper electrode 230. The thin-film encapsulation layer 300 may have a stack structure of an inorganic layer and an organic layer.

Even though not illustrated, a capping layer and a blocking layer may be disposed between the upper electrode 230 and the thin-film encapsulation layer 300.

Figure 11:
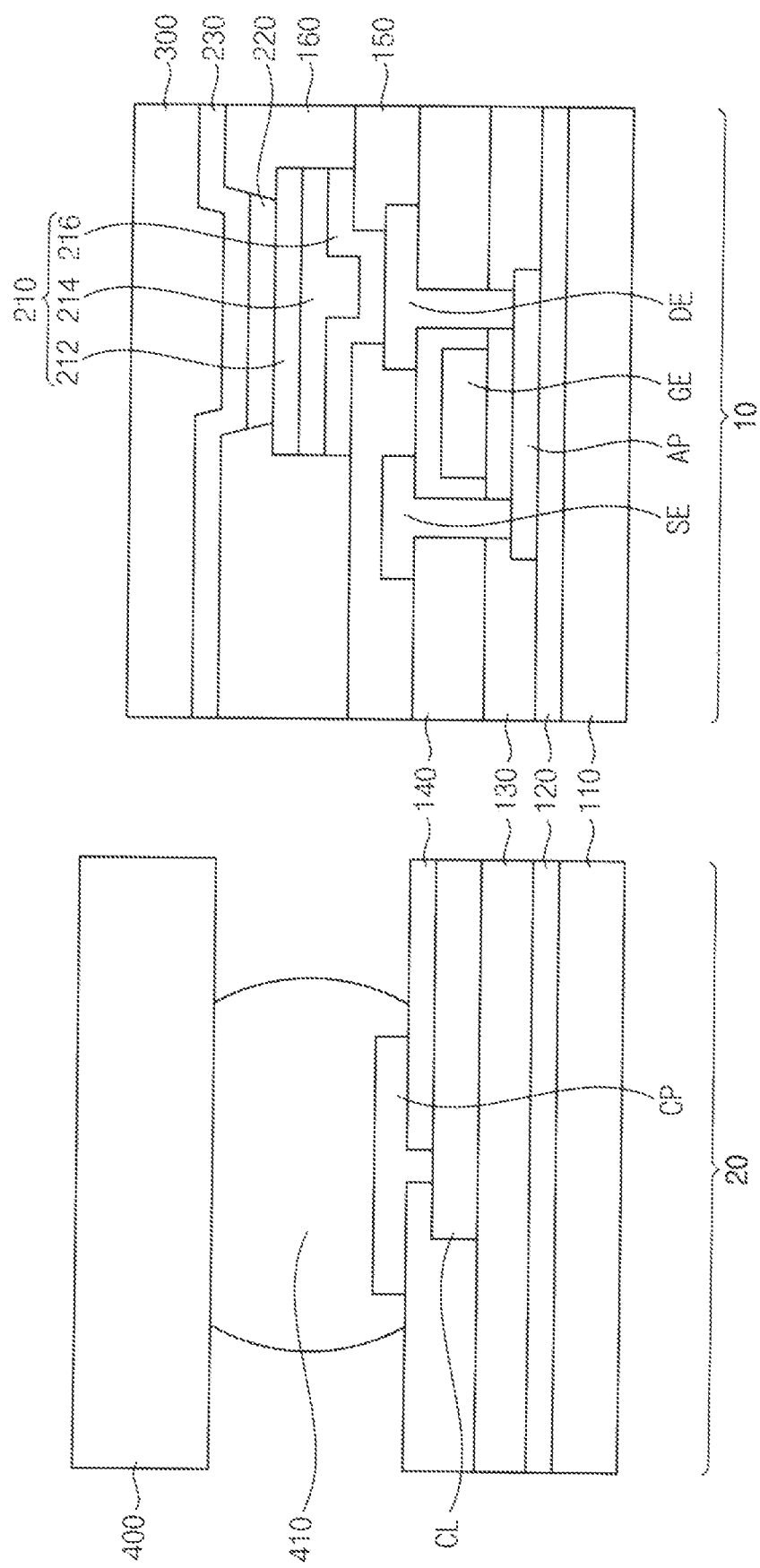
Figure 12:
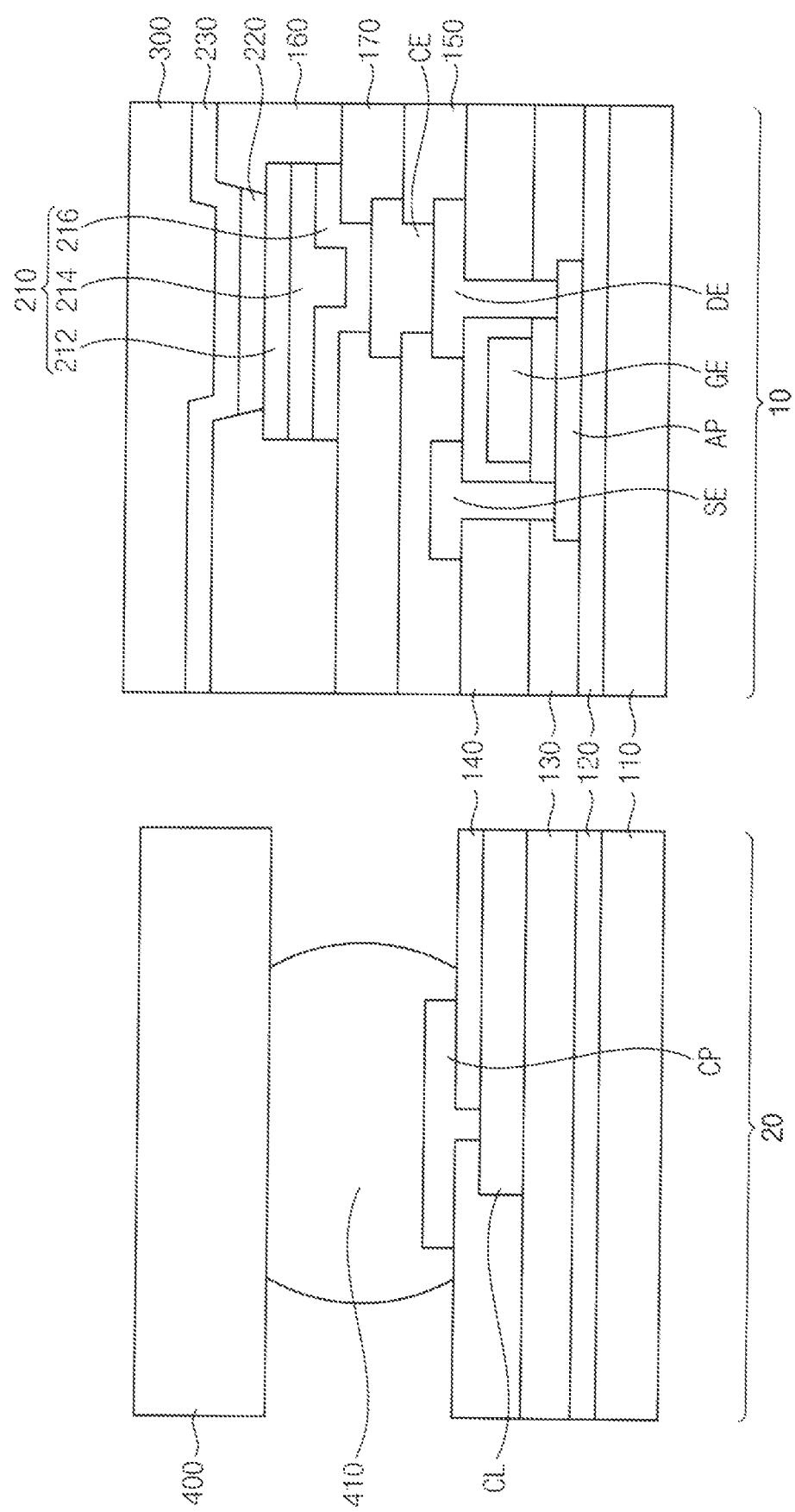
FIG. 12 illustrates a cross-sectional view of a display device manufactured according to an embodiment.

Referring to FIG. 11, the connection pad CP is connected to a driving chip 400. For example, the connection pad CP is connected to the driving chip 400 through a conductive bump 410.

As previously explained, the connection pad CP formed in the peripheral area 20 of the display device may be exposed without a passivation layer covering the connection pad CP in the process of etching the lower electrode layer 211. Thus, when a conventional etching composition including phosphoric acid is used, silver particles may be generated due to the exposed connection pad CP. The silver particles may be transferred to the lower electrode in the following processes including a stripping process, a rinsing process or the like thereby causing defects of the display device.

Etching compositions according to embodiments may have selectivity for a silver-containing thin film with respect to a metal oxide such as indium oxide, and may prevent damage of other metal layers including aluminum or the like, and may prevent reductive precipitation of silver particles.

Furthermore, when etching a silver-containing thin film, the etching composition may prevent etching residues and may form a CD-skew having appropriate length.

Furthermore, the stability of the etching compositions for cumulative use and over time may be improved.

Thus, defects in manufacturing processes for a display device may be reduced, and the reliability of the display device may be improved.

In an embodiment, the lower electrode 210 of the organic light-emitting diode may contact the drain electrode DE. However, in an embodiment, as illustrated in FIG. 12, the lower electrode 210 of the organic light-emitting diode may be electrically connected to the drain electrode DE through a connection electrode CE. The connection electrode CE may pass through the third insulation layer 150 to contact the drain electrode DE. A fourth insulation layer 170 may be disposed between the third insulation layer 150 and a pixel-defining layer 160, and the lower electrode 210 may pass through the fourth insulation layer 170 to contact the connection electrode CE.

In an embodiment, the connection pad CP disposed in the peripheral area 20 and electrically connected to the driving chip 400 through the conductive bump 410 may be formed from a same layer as the drain electrode DE. However, in an embodiment, the connection pad CP may be formed from a same layer as the connection electrode CE.

Hereinafter, effects of embodiments will be explained with reference to experiments and examples.

Examples and Comparative Examples

Etching compositions for Examples and Comparative Examples were prepared according to the following Tables 1 and 2. In Table 1, the unit of the content is wt % and the remainder of the etching compositions was water.

TABLE 1

| | A | B | C1 | C2 | D1 | D2 | E | F | G |
|---|---|---|---|---|---|---|---|---|---|
| Example1 | 7 | 5 | 30 | 20 | 10 | 0 | 0.03 | 2 | 0 |
| Example2 | 7 | 5 | 30 | 20 | 15 | 0 | 0.03 | 2 | 0 |
| Example3 | 9 | 5 | 30 | 20 | 10 | 0 | 0.03 | 0.5 | 0 |
| Example4 | 7 | 5 | 30 | 20 | 0 | 10 | 0.03 | 2 | 0 |
| Example5 | 7 | 5 | 30 | 20 | 10 | 0 | 0.03 | 0.5 | 0 |
| Comparative Example 1 | 7 | 5 | 30 | 20 | 0 | 0 | 0.03 | 2 | 10 |
| Comparative Example 2 | 7 | 5 | 30 | 20 | 0 | 0 | 0.03 | 2 | 0 |
| Comparative Example 3 | 7 | 5 | 30 | 20 | 0.5 | 0 | 0.03 | 2 | 0 |
| Comparative Example 4 | 7 | 5 | 30 | 20 | 10 | 0 | 0.03 | 0.01 | 0 |
| Comparative Example 5 | 7 | 5 | 30 | 20 | 10 | 0 | 0.03 | 15 | 0 |

TABLE 2

| Component | Name of component |
|---|---|
| A | nitric acid |
| B | Methanesulfonic acid |
| C1 | Citric acid |
| C2 | Acetic acid |
| D1 | Calcium nitrate |
| D2 | Ammonium nitrate |
| E | Ferric nitrate |
| F | Glycine |
| G | Ammonium bisulfate |

Experiment 1—Evaluation of Etching Characteristics

A double film of ITO/Ag was formed on a glass substrate, and a photoresist pattern was formed on the double film.

The results of etching the Ag layer (silver-containing thin film layer) with the etching compositions of Examples 1 to 5 and Comparative Examples 1 to 5 are shown in Table 3 below.

TABLE 3

| | New Etching Solution (Ag 0 ppm) | | | | Old Etching Solution (Ag 2,000 ppm) | | | | CD-skew |
|---|---|---|---|---|---|---|---|---|---|
| | CD-skew (one side) | Ag residue | Ag resorption | ITO E/R | CD-skew (one side) | Ag residue | Ag resorption | ITO E/R | variation (one side) |
| Example1 | excellent | good | good | good | excellent | good | good | good | great |
| Example2 | excellent | good | good | good | excellent | good | good | good | great |
| Example3 | great | good | good | good | great | good | good | good | great |
| Example4 | great | good | good | good | great | good | good | good | great |
| Example5 | excellent | good | good | good | excellent | good | good | good | great |
| Comparative Example 1 | great | good | bad | bad | great | good | bad | bad | great |
| Comparative Example 2 | great | bad | good | good | bad | bad | good | good | great |
| Comparative Example 3 | good | bad | good | good | good | bad | good | good | great |
| Comparative Example 4 | great | good | good | good | good | good | good | good | bad |
| Comparative Example 5 | great | bad | good | good | great | bad | good | good | great |

Referring to Table 3, the experiment was conducted under two conditions at about 40 degrees Celsius. In embodiments, when the etching composition is used for the first time, silver is not dissolved in the etching composition. Therefore, the experiment was conducted with a new etching solution in which silver was not dissolved (Ag 0 ppm).

In embodiments, the etching composition may be repeatedly used in an etching apparatus. Accordingly, silver etched by the etching composition may be dissolved in the etching composition. Therefore, the experiment was conducted even with the old etching solution (Ag 2,000 ppm) in which silver was dissolved.

In the case of using the etching compositions of Examples 1 to 5, the CD-skew (distance between an end of the photoresist pattern and an end of the Ag layer) was evaluated as great or higher for both the new and old etching solutions. In detail, for Examples 1, 2 and 5, the CD-skew was evaluated excellent, and for Examples 3 and 4, the CD-skew was evaluated great. Excellent CD-skew means that the CD-skew is measured to be less than 0.2 micrometers. Great CD-skew means that the CD-skew is more than 0.2 micrometers and measured less than 0.4 micrometers.

For both the new etchant and the old etchant, the measurement result of Ag residue and Ag resorption was determined to be good. When the result of the Ag residue was measured as good, it means that no Ag residue was generated. In addition, the fact that the results for Ag re-adsorption were determined to be good means that the number of silver particles was re-adsorbed to less than 5 on the glass substrate.

CD-skew variation refers to the difference between the CD-skew when using the new etchant and the old etchant. For Examples 1 to 5, all of the variations in CD-skew were evaluated as great. The great variation of the CD-skew means that the difference is more than 0.05 micrometers and less than 0.1 micrometers.

However, in Comparative Example 1 containing ammonium bisulfate without calcium nitrate and ammonium nitrate, Ag re-adsorption occurred. In addition, in Comparative Example 2 that did not contain calcium nitrate and ammonium nitrate, Ag residue was generated, and the CD-skew was evaluated as bad. A bad CD-skew means that the CD-skew is 0.6 micrometers or more.

In addition, in Comparative Example 3 containing only calcium nitrate in a small amount (for example, 0.5 wt %), an Ag residue was generated, and the CD-skew was evaluated as good. Good CD-skew means CD-skew is greater than 0.4 micrometers and less than 0.6 micrometers.

In addition, in Comparative Example 4 containing less glycine, the CD-skew was evaluated as good for the old etchant.

In Comparative Example 5 containing an excessive amount of glycine, the silver residue was evaluated as bad. When the above-described silver residue is bad, it means that silver residue has occurred. The occurrence of the above-described silver residue means that the silver remains without being etched in the portion not covered with the photoresist.

ITO E/R (ITO ETCH RATE) was evaluated as good for both Examples 1 to 5 and Comparative Examples 2 to 5. Good ITO E/R means that ITO disposed under the silver-containing thin film is etched at a rate of 0.3 Å/sec or less. However, in the case of Comparative Example 1, since it contained ammonium bisulfate, ITO E/R was evaluated as bad. The bad ITO E/R means that the ITO disposed under the silver-containing thin film is etched at a rate of 0.4 Å/sec or more.

Since the etching composition is provided only for a limited time during the etching of the silver-containing thin film, in the case of using Examples 1 to 5, the silver-containing thin film can be etched while minimizing the etching of ITO. Through this, the embodiments may etch the silver-containing thin film and ITO by dividing the etching operations.

Embodiments may be used for etching a silver-containing thin film or a multiple layer including the silver-containing thin film. For example, embodiments may be used for forming wirings or electrodes, or for manufacturing various electronic devices including the wirings or the electrodes.

The foregoing is illustrative of embodiments and is not to be construed as limiting thereof. Although embodiments have been described, those skilled in the art will readily appreciate that many modifications are possible in the embodiments without materially departing from the novel teachings and aspects of the present inventive concept. Accordingly, all such modifications are intended to be included within the scope of the present inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the present inventive concept, as set forth in the following claims and equivalents thereof.

What is claimed is:

1. An etching composition for a silver-containing thin film, the etching composition comprising an inorganic acid compound, a sulfonic acid compound, an organic acid compound, a nitrate, a metal oxidizing agent, an amino acid compound, and water, the etching composition comprising:
   1 wt % to 13 wt % of the inorganic acid compound,
   0.1 wt % to 7 wt % of the sulfonic acid compound,
   30 wt % to 55 wt % of the organic acid compound,
   1 wt % to 17 wt % of the nitrate,
   0.01 wt % to 0.09 wt % of the metal oxidizing agent,
   0.1 wt % to 7 wt % of the amino acid compound, and
   a remainder of the etching composition being water.

2. The etching composition of claim 1, wherein the sulfonic acid compound comprises at least one selected from the group consisting of methanesulfonic acid, ethanesulfonic acid, p-toluenesulfonic acid, benzenesulfonic acid, amino methylsulfonic acid, and sulfamic acid.

3. The etching composition of claim 1, wherein the organic acid compound comprises at least one selected from the group consisting of acetic acid, citric acid, glycolic acid malonic acid, lactic acid, tartaric acid, butanoic acid, formic acid, gluconic acid, oxalic acid, pentanoic acid, sulfobenzoic acid, sulfosuccinic acid, sulfophthalic acid, salicylic acid, sulfosalicylic acid, benzoic acid, glyceric acid, succinic acid, malic acid, isocitric acid, propenoic acid, iminodiacetic acid and ethylenediaminetetraacetic acid.

4. The etching composition of claim 1, wherein the nitrate comprises at least one selected from the group consisting of sodium nitrate, potassium nitrate, ammonium nitrate, calcium nitrate, magnesium nitrate, and aluminum nitrate.

5. The etching composition of claim 1, wherein the metal oxidizing agent comprises at least one selected from the group consisting of ferric nitrate, ferric sulfate, copper, and copper sulfate.

6. The etching composition as claimed in claim 1, wherein the amino acid compound comprises at least one selected from the group consisting of glycine, alanine, valine, leucine, isoleucine, serine, threonine, aspartic acid, cysteine, and methionine.

7. The etching composition of claim 1, wherein the inorganic acid compound comprises nitric acid.

8. An etching composition for a silver-containing thin film, the etching composition comprising an inorganic acid compound, a sulfonic acid compound, an organic acid compound, a nitrate, a metal oxidizing agent, an amino acid compound, and water, wherein:

the inorganic acid compound comprises nitric acid,
the sulfonic acid compound comprises methanesulfonic acid,
the organic acid compound comprises citric acid and acetic acid,
the nitrate comprises calcium nitrate and ammonium nitrate,
the metal oxidizing agent comprises ferric nitrate, and
the amino acid compound comprises glycine.

9. The etching composition of claim 8, wherein the etching composition does not include ammonium bisulfate.

10. The etching composition of claim 8, wherein the etching composition does not include phosphoric acid.

* * * * *